United States Patent
Ohsawa

(10) Patent No.: US 7,433,242 B2
(45) Date of Patent: Oct. 7, 2008

(54) SEMICONDUCTOR MEMORY DEVICE AND DRIVING METHOD OF THE SAME

(75) Inventor: Takashi Ohsawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 193 days.

(21) Appl. No.: 11/297,453

(22) Filed: Dec. 9, 2005

(65) Prior Publication Data

US 2007/0007574 A1    Jan. 11, 2007

(30) Foreign Application Priority Data

Jul. 6, 2005 (JP) ............................. 2005-198016

(51) Int. Cl.
*G11C 11/34* (2006.01)

(52) U.S. Cl. ........................... 365/185.27; 365/185.05; 365/185.18

(58) Field of Classification Search ............ 365/185.27, 365/145, 185.05, 185.18, 185.19, 185.03
See application file for complete search history.

(56) References Cited

U.S. PATENT DOCUMENTS

| 6,538,916 | B2 | 3/2003 | Ohsawa | |
|---|---|---|---|---|
| 6,617,651 | B2 | 9/2003 | Ohsawa | |
| 6,687,152 | B2 | 2/2004 | Ohsawa | |
| 6,946,712 | B2 * | 9/2005 | Asao | 257/395 |
| 6,949,768 | B1 * | 9/2005 | Anderson et al. | 257/74 |
| 7,016,226 | B2 * | 3/2006 | Shibata et al. | 365/185.03 |
| 7,042,052 | B2 * | 5/2006 | Bhattacharyya | 257/347 |
| 2005/0128787 | A1 * | 6/2005 | Mouli | 365/149 |
| 2007/0007574 | A1 | 1/2007 | Ohsawa | |
| 2007/0064482 | A1 * | 3/2007 | Takeuchi | 365/185.03 |

OTHER PUBLICATIONS

U.S. Appl. No. 12/031,111, filed Feb. 14, 2008, Ohsawa.

* cited by examiner

*Primary Examiner*—Dang T Nguyen
(74) *Attorney, Agent, or Firm*—Oblon, Spivak, McClelland, Maier & Neustadt, P.C.

(57) ABSTRACT

A semiconductor memory device includes a semiconductor substrate including a semiconductor layer on a first insulation film; a memory cell including a source and a drain formed in the semiconductor layer, and a floating body region provided between the source and the drain, the memory cell storing data according to an amount of charges accumulated in the floating body region; a second insulation film provided on the floating body region of the memory cell; a word line provided on the second insulation film; a bit line connected to the drain; a source line connected to the source; and a plate electrode electrically insulated from the floating body region by the first insulation film, wherein in at least a part of a period for writing data to the memory cell, a potential of the plate electrode is changed to reduce an absolute value of a threshold voltage of the memory cell.

19 Claims, 10 Drawing Sheets

MC

SEMICONDUCTOR MEMORY DEVICE AND DRIVING METHOD OF THE SAME

CROSS-REFERENCE TO RELATED APPLICATION

This application is based upon and claims the benefit of priority from the prior Japanese Patent Applications No. 2005-198016, filed on Jul. 6, 2005, the entire contents of which are incorporated herein by reference.

BACKGROUND OF THE INVENTION

1. Field of the Invention

The present invention relates to a semiconductor memory device and a driving method of a semiconductor memory device.

2. Related Art

Recently, following scale-down of elements, development of a full-depletion type floating body cell (FBC) memory (hereinafter, also referred to as "FD-FBC") is underway. In the FBC memory, each FBC memory stores data "1" or "0" according to an amount of charges stored in a floating body formed on a SOI layer. The FD-FBC differs from a partial-depletion type FBC in that a factor for determining a threshold voltage is not an impurity concentration of a body region but electric field influences of a gate electrode (word line) and a plate electrode on a channel surface. In the FD-FBC, a sufficient potential is applied to the plate electrode, thereby forming a potential well in the body region and storing charges accordingly. Due to this, even if the SOI layer of the FD-FBC is made thin, elements can be scaled down while keeping a threshold voltage difference $\Delta$Vth between the memory cell that stores the data "1" and the memory cell that stores the data "0" large.

However, the threshold voltage of the memory cell is increased as the FD-FBC is scaled down for the following reasons. To suppress short channel effect, it is necessary to reduce a thickness of a floating body (a semiconductor layer for forming the body region) as the FD-FBC is scaled down. If the body region is thin, a potential having a large absolute value needs to be applied into the plate region so as to hold the charges in the body region. Accordingly, it is disadvantageously difficult to form an inversion layer on a surface of the body region (channel region), with the result that the threshold voltage of the memory cell is increased.

Further, it is possible that the absolute value of the potential of the plate electrode is increased to increase an amount of signal. If so, the threshold voltage of the memory cell is increased, as well.

If the threshold voltage of the memory cell is increased, it is necessary to apply a high word-line voltage during data writing. In a case that an nMOSFET is employed as the memory cell, for example, the threshold voltage of the memory cell that stores the data "0" is particularly increased. In order to write the data "1" to the memory cell that stores the data "0", the potential of the word line is required to be increased so as to be able to form a channel in the memory cell that stores the data "0" having the high threshold voltage. This is because it is necessary to cause impact ionization in the memory cell that stores the data "0".

When the potential of the word line is high, the word line potential may possibly exceed a breakdown voltage of MOSFETs on peripheral circuits such as a row decoder and a word line driving-circuit. A MOSFET formed on an SOI substrate, in particular, is lower in breakdown voltage of the drain than a MOSFET formed on a bulk substrate. As a result, there is a disadvantage that the peripherals are broken down and the semiconductor memory device does not appropriately operate.

When the potential of the word line is increased, a leak current from a drain is increased. This may possibly deteriorate cutoff characteristics. As a result, the leak current flowing in a standby state of the semiconductor memory device is disadvantageously increased.

SUMMARY OF THE INVENTION

A semiconductor memory device according to an embodiment of the invention comprises a semiconductor substrate including a semiconductor layer on a first insulation film; a memory cell including a source formed in the semiconductor layer, a drain formed in the semiconductor layer, and a floating body region provided between the source and the drain, the memory cell storing data according to an amount of the charges accumulated in the floating body region; a second insulation film provided on the floating body region of the memory cell; a word line provided on the second insulation film; a bit line connected to the drain; a source line connected to the source; and a plate electrode electrically insulated from the floating body region by the first insulation film, wherein in at least a part of a period for writing data to the memory cell, a potential of the plate electrode is changed to reduce an absolute value of a threshold voltage of the memory cell.

A semiconductor memory device according to an embodiment of the invention comprises a semiconductor substrate including a semiconductor layer on a first insulation film; a memory cell including a source formed in the semiconductor layer, a drain formed in the semiconductor layer, and a floating body region provided between the source and the drain, the memory cell storing data according to an amount of charges accumulated in the floating body region; a second insulation film provided on the floating body region of the memory cell; a word line provided on the second insulation film; a bit line connected to the drain; and a source line connected to the source, wherein the semiconductor substrate is electrically insulated from the floating body region by the first insulation film, and in at least a part of a period for writing data to the memory cell, a potential of the semiconductor substrate is changed to reduce an absolute value of a threshold voltage of the memory cell.

A driving method of a semiconductor memory device according to an embodiment of the invention, the semiconductor memory device comprising a memory cell including a source formed in a semiconductor layer on a first insulation film, a drain formed in the semiconductor layer, and a floating body region provided between the source and the drain; a second insulation film provided on the floating body region of the memory cell; a word line provided on the second insulation film; a bit line connected to the drain; a source line connected to the source; and a plate electrode electrically insulated from the floating body region by the first insulation film, the method comprises a potential of the plate electrode in a data write operation is changed from a potential of the plate electrode in a data retention state.

A driving method of a semiconductor memory device according to an embodiment of the invention, the semiconductor memory device comprising a semiconductor substrate including a semiconductor layer on a first insulation film; a memory cell including a source formed in a semiconductor layer on the first insulation film, a drain formed in the semiconductor layer, and a floating body region provided between the source and the drain; a second insulation film provided on the floating body region of the memory cell; a word line provided on the second insulation film; and a bit line connected to the drain; a source line connected to the source, wherein the semiconductor substrate is electrically insulated from the floating body region by the first insulation film, the method comprises a potential of the semiconductor substrate in a data write operation is changed from a potential of the semiconductor substrate in a data retention state.

DETAILED DESCRIPTION OF THE INVENTION

Embodiments of the present invention will be described more specifically with reference to the drawings. Note that the invention is not limited by the embodiments.

First Embodiment

Figure 1:
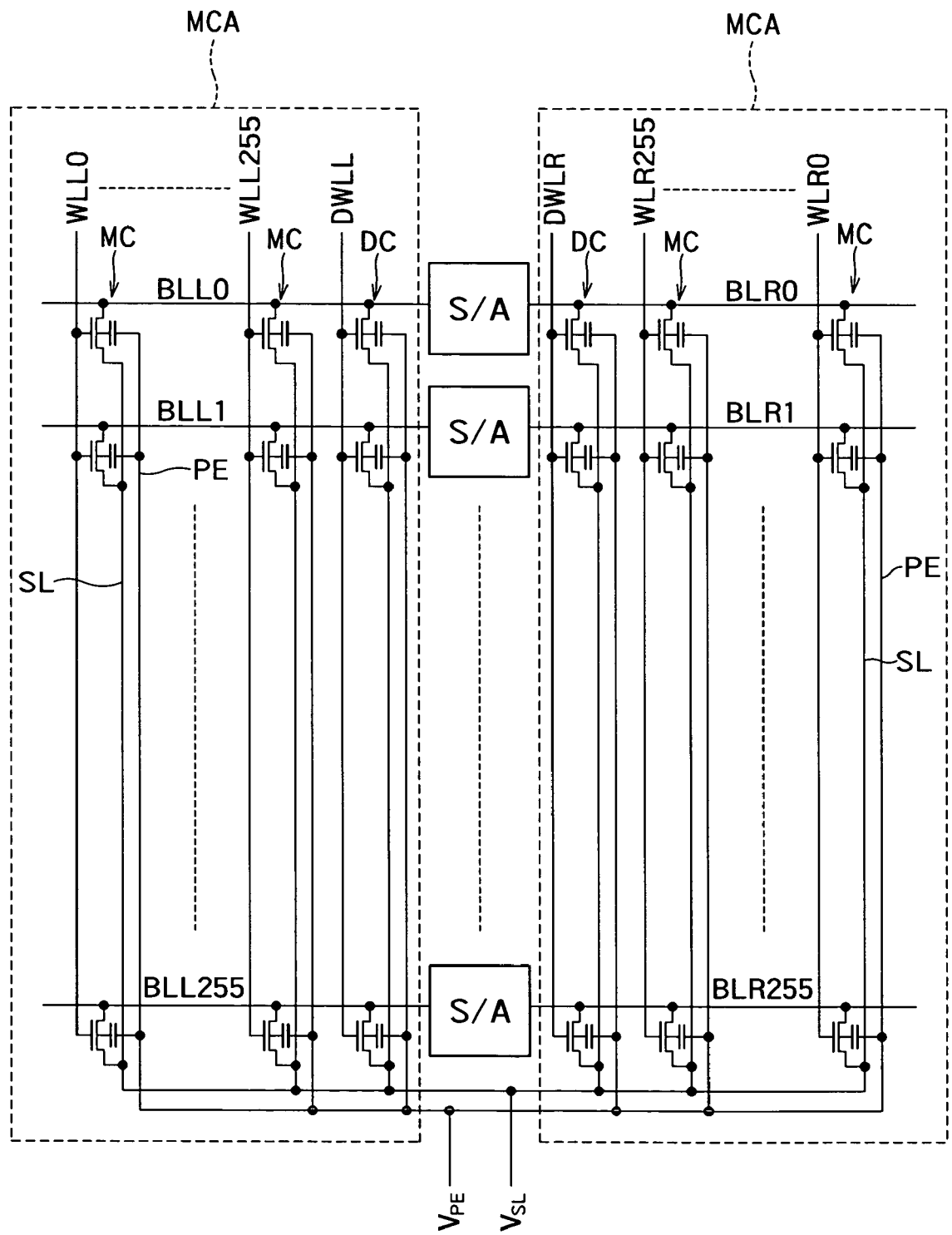
FIG. 1 is a circuit diagram that shows a configuration of a semiconductor memory device 100 according to a first embodiment of the present invention.

FIG. 1 is a circuit diagram that shows a configuration of a semiconductor memory device 100 according to a first embodiment of the present invention. The semiconductor memory device 100 includes, on an SOI substrate, memory cells MCs, word lines WLL0 to WLL255 and WLR0 to WLR255, bit lines BLL0 to BLL255 and BLR0 to BLR255, a plate electrode PE, and sense amplifiers S/A.

The memory cell MC is representatively an FD-FBC configured by nMOSFET. The memory cell MC can store data according to a difference in an amount of charges stored in a floating body (hereinafter, also referred to as "body region"). When the memory cell MC stores data, charges are stored in the body region or emitted therefrom.

The memory cells MCs, which are arranged in a matrix, constitute a memory cell array MCA. Two memory cell arrays MCAs are provided on the left and the right of the sense amplifiers S/A, respectively. These memory cell arrays MCAs are equal in configuration. Therefore, the memory cell array MCA provided on the left of the sense amplifiers S/A will be described but that provided on the right thereof will not be described herein. According to this embodiment, one memory cell array MCA can store data of 64 kilobits.

Each of the word lines WLL0 to WL255 extends in a row direction of the memory cell array MCA and is connected to gates of the memory cells MCs arranged in the row direction. Each of the bit lines BLL0 to BLL255 extends in a column direction of the memory cell array MCA and is connected to drains of the memory cells MCs arranged in the column direction. Source lines SLs extend in parallel to the word lines WLL0 to WLL255, respectively, and each of the source line SL is connected to sources of the memory cells MCs arranged in the row direction. The bit lines BLL0 to BLL255 are orthogonal to the word lines WLL0 to WLL255 and the source lines SLs.

The semiconductor memory device 100 has an open bit line structure. Accordingly, each sense amplifier S/A is connected to the bit line BLLi (where i=0 to 255) and the bit line BLRi (where i=0 to 255) provided on the left and the right of the sense amplifier S/A, respectively.

The plate electrode PE may be provided in a plate form under one memory cell array MCA. Alternatively, the plate electrode PE may be provided in a plate form under the two memory cell arrays MCAS, which are provided on the left and the right of the sense amplifiers S/A, in common. Alternatively, the plate electrode PE may be divided into segments to correspond to one or a plurality of memory cells MCs within one memory cell array MCA. A plate potential $V_{PE}$ is applied to the plate electrode PE.

A dummy cell DC is provided in every column of the memory cell array MCA. One dummy word line DWLL is provided to correspond to the dummy cells DCs. This dummy word line DWLL is connected to gates of the dummy cells DCs. Drains of the dummy cells DCs are connected to the bit lines BLL0 to BLL255, respectively. The dummy cells DCs alternately store data "0" and data "1". A reference data is generated by short-circuiting between the dummy cell DC that stores the data "0" and the dummy cell DC that stores the data "1" using a circuit (not shown).

The sense amplifiers S/As are provided to correspond to the respective bit lines. Each sense amplifier S/A receives information data from one of the left and right memory cell arrays MCAs, and receives the reference data from the other memory cell array MCA. By comparing the information data with the reference data, the sense amplifier S/A determines whether the information data is "0" or "1". A reference potential is an intermediate potential which is between the data "0" and the data "1", and which is generated by short-circuiting between the dummy cell DC that stores the data "0" and the dummy cell DC that stores the data "1". The information data is data acquired from the memory cell MC located at an intersecting point between the selected word line and the selected bit line. A data detecting scheme is not limited to the scheme stated above and other well-known schemes can be used.

Figure 2:
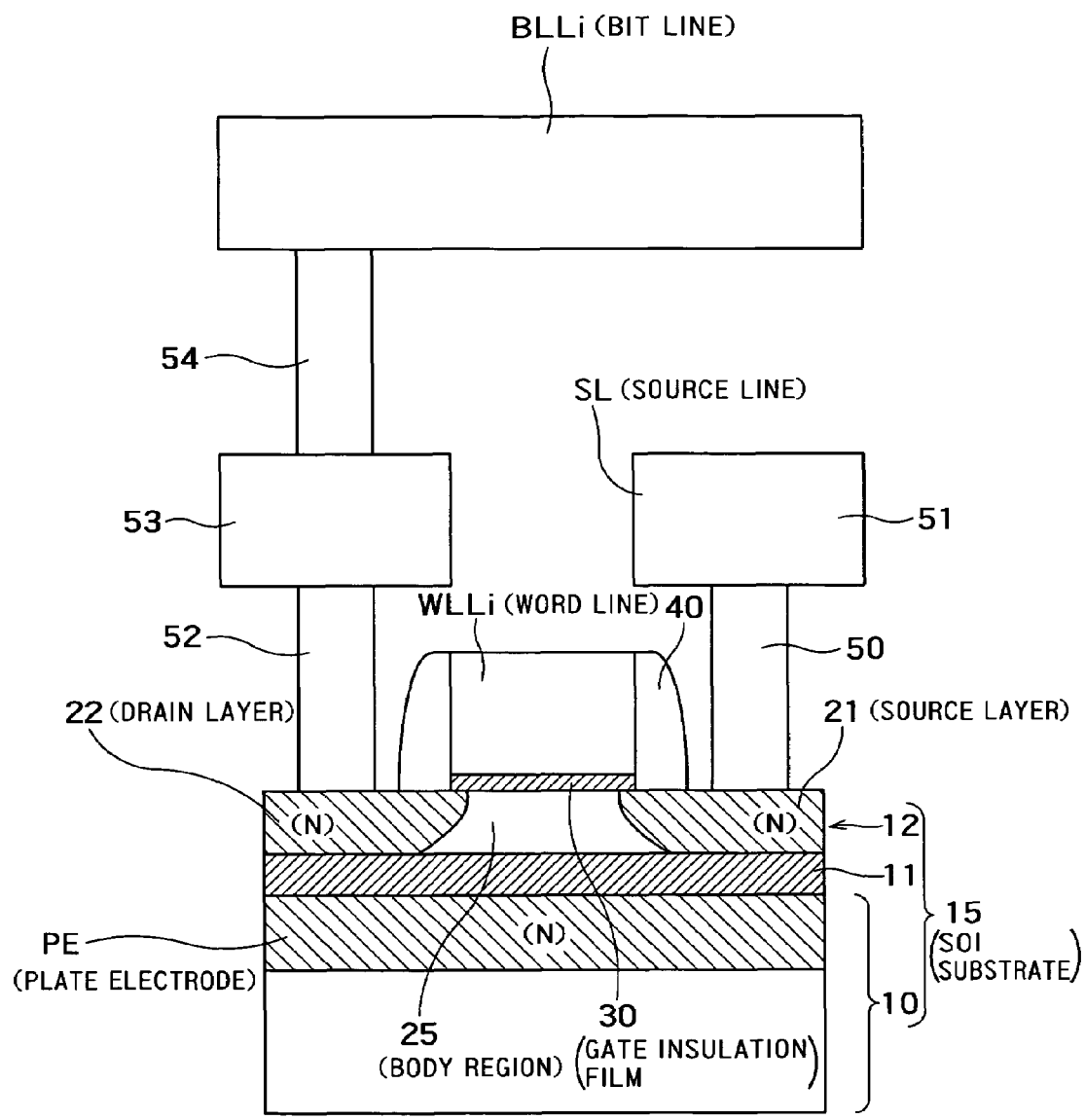
FIG. 2 is a cross-sectional view of one memory cell MC according to a first embodiment of the present invention.

FIG. 2 is a cross-sectional view of one memory cell MC taken along the bit line BLLi. The memory cell MC is provided on an SOI substrate 15. The SOI substrate 15 serving as a semiconductor substrate includes a bulk silicon substrate 10 (hereinafter, also referred to as "substrate 10"), a buried oxide (BOX) layer 11 serving as a first insulation film, and an SOI layer 12 serving as a first semiconductor layer.

A source layer 21, a drain layer 22 and a body region 25 arranged between the source layer 21 and the drain layer 22 are provided in the SOI layer 12. While the body region 25 may consist of p-type silicon, it may consist of intrinsic silicon. The body region 25 is surrounded by the source layer 21, the drain layer 22, the BOX layer 11, and a gate insulation film 30, whereby the body region 25 is in an electrically floating state. In addition, the body region 25 is isolated by an element isolation in a perpendicular direction to the sheet.

The gate insulation film 30 serving as a second insulation film is provided on a surface of the body region 25. The word line WLLi is provided on the gate insulation film 30. In FIG. 2, the word line WLLi extends in the perpendicular direction to the sheet. The source line SL is electrically connected to a source diffusion layer 21 via a contact 50. The source line SL extends in the perpendicular direction to the sheet, as well. The bit line BLLi is electrically connected to the drain layer 22 through contacts 52, 54 and a conductor layer 53 which is provided in the same layer as the layer including the source line SL4. The bit line BLLi extends in a perpendicular direction to the word line WLLi. Sidewall films 40 are provided on both side surfaces of the word line WLLi.

The plate electrode PE is formed on a surface of the substrate 10 under the BOX layer 11. The plate electrode PE is formed by implanting n-type impurities into the p-type substrate 10 and diffusing the n-type impurities. In this embodiment, while the plate electrode PE is an n-type electrode, it suffices that the n-type impurities at a concentration equal to or higher than a predetermined concentration are implanted into the substrate 10 so that a resistance of the plate electrode PE can be sufficiently reduced. The plate electrode PE is not, therefore, necessarily the n-type electrode but may be a p-type electrode. In addition, if a well (not shown) opposite in conductive type to the substrate 10 is provided in the substrate 10, the plate electrode PE may be formed by a material equal in conductive type to either the substrate 10 or the well.

If an n-type MOSFET is employed as each memory cell MC, then the memory cell MC stores the data "1" by accumulating holes in the body region 25 and stores the data "0" by emitting the holes (annihilating the holes) from the body region 25. In order to accumulate the holes in the body region 25, the memory cell MC is operated in a saturation state to cause the impact ionization in the body region 25. In order to emit the holes from the body region 25, a forward bias is applied to a pn junction between the body region 25 and the drain region 22.

If the number of holes accumulated in the body region 25 changes, a threshold voltage of the memory cell MC is changed by body effect. When each memory cell MC is the n-type MOSFET, a threshold voltage Vth1 of the memory cell MC having a large quantity of accumulated holes is lower than a threshold voltage Vth0 of the memory cell MC having a small quantity of accumulated holes. The memory cells MCs can thereby store the data "1" or "0", respectively. At a data retention, a negative potential is applied to the plate electrode PE, thereby a potential well is formed in the body region 25. As a result, sufficient holes are held in the body region 25 in the memory cell MC that stores the data "1".

When the same gate voltage and the same drain voltage are applied to the memory cells MCs, a drain-source current flowing through the memory cell MC storing data "1" is higher than that flowing though the memory cell MC storing the data "0". By comparing the drain-source current of each memory cell MC with a reference current, therefore, logic of the data stored in the memory cell MC can be detected (read). It is noted that the reference current is an intermediate current between the drain-source current flowing through the memory cell MC storing the data "1" and that flowing through the memory cell MC storing the data "0".

Figure 3:
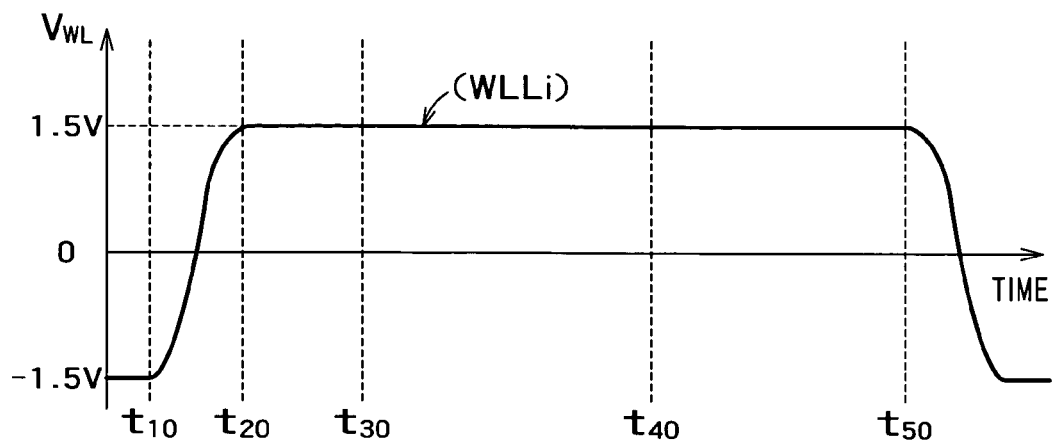
FIG. 3 is a timing chart showing operations performed by the semiconductor memory device 100.
Figure 4:
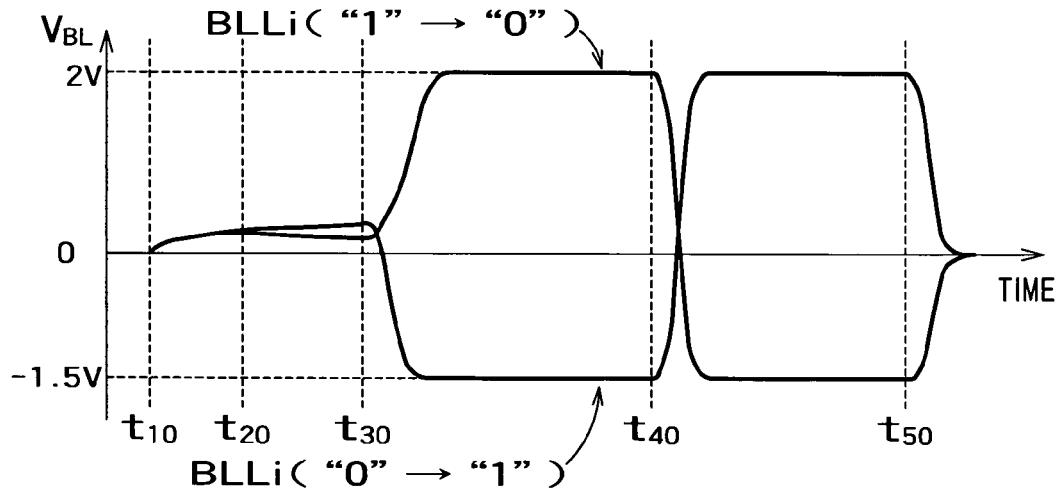
FIG. 4 is a timing chart showing operations performed by the semiconductor memory device 100.
Figure 5:
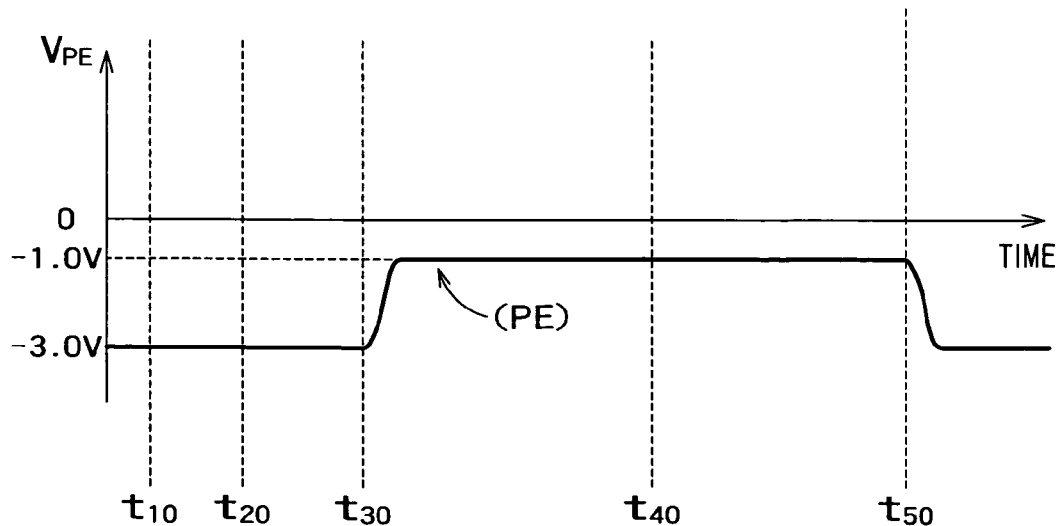
FIG. 5 is a timing chart showing operations performed by the semiconductor memory device 100.

FIGS. 3 to 5 are timing charts showing operations performed by the semiconductor memory device 100. FIGS. 3 to 5 show operations of temporarily reading the data stored in the memory cell MC, and writing data obtained by logically inverting the read data to the memory cell MC. FIGS. 3 to 5 show a word line voltage $V_{WL}$ of the word line WLLi, a bit line voltage $V_{BL}$ of the bit line BLLi, and the plate voltage $V_{PE}$ of the plate electrode PE, respectively. With reference to FIG. 4, a curve BLLi ("1"→"0") indicates the potential of the bit line BLLi when the data "1" is read from the memory MC and the data "0" is written thereto. A curve BLLi ("0"→"1") indicates the potential of the bit line BLLi when the data "0" is read from the memory MC and the data "1" is written thereto. In this embodiment, a voltage $V_{SL}$ of the source line SL is 0V. However, the voltage $V_{SL}$ is not limited to 0V.

At the data retention (at 0 to t10), the word line voltage $V_{WL}$ is −1.5V, the bit line voltage $V_{BL}$ is 0V, and the plate voltage $V_{PE}$ is −3V, for example. Since the plate voltage $V_{PE}$ is a lower potential than the bit line voltage $V_{BL}$ and a source potential, the holes in the body region 25 are held therein. The data "1" stored in the memory cell MC is thereby held.

At a data read operation and at a refresh operation (at t10 to t40), the selected word line WLL$_i$ is driven and the word line voltage $V_{WL}$ thereof is raised to, for example, 1.5V. The data stored in the memory cell MC is thereby transmitted to the bit line BLLi. The moment sufficient signals are transmitted to the bit line BLLi (at t30), the sense amplifier S/A amplifies the data and latches the amplified data. At this moment, the plate voltage $V_{PE}$ is raised to, for example, −1V. In other words, an absolute value of the plate voltage $V_{PE}$ is reduced. In other words, a potential difference between the plate voltage $V_{PE}$ and the source line voltage $V_{SL}$ is reduced. By doing so, the plate voltage $V_{PE}$ is closer to the source line voltage $V_{SL}$. As a result, the potential well formed in the body region 25 is shallower, so that a threshold voltage Vth0 of the memory cell MC storing the data "0" can be reduced. At this moment, if the source line voltage $V_{SL}$ is changed, the plate voltage $V_{PE}$ may be controlled so as to reduce the potential difference between the plate voltage $V_{PE}$ and the source line voltage $V_{SL}$. During the refresh operation, the data "0" is written to the memory cell MC that originally stores the data "0". It is, therefore, unnecessary to reduce the threshold voltage Vth0. In this embodiment, however, since it often takes some time to change the potential of the plate electrode PE, the plate voltage $V_{PE}$ is changed from −3V to −1V at the time t30.

The sense amplifier S/A then reverses the latched data to the memory cell MC (at t40 to t50). At this moment, as shown in FIG. 4, if the data "1" is detected, this data "1" is then inverted to the data "0", and the data "0" is written to the memory cell MC. It the data "0" is detected, this data "0" is then inverted to the data "1", and the data "1" is written to the memory cell MC. At a data write operation, the plate voltage $V_{PE}$ is raised to, for example, −1V similarly to the data read operation and the refresh operation. By doing so, the threshold voltage Vth0 of the memory cell MC storing the data "0" can be reduced.

After the data write operation, the word line voltage $V_{WL}$ is returned to −1.5V and the bit line voltage $V_{BL}$ is returned to 0V. At this moment, the plate voltage $V_{PE}$ is also returned to −3V. By doing so, the memory cell MC is turned into a data retention state. As can be seen, the plate voltage $V_{PE}$ is set to a level having a large absolute value (a level further from the source line voltage $V_{SL}$) in the data retention state, and set to a level having a small absolute value (closer to the source line voltage $V_{SL}$) during the refresh time and data read/write time (t30 to t50). By so setting, during the data retention, it is possible to ensure holding the data "1", and during the refresh time and the data read/data write time, the threshold voltage Vth0 of the memory cell MC storing the data "0" can be reduced.

Figure 6:
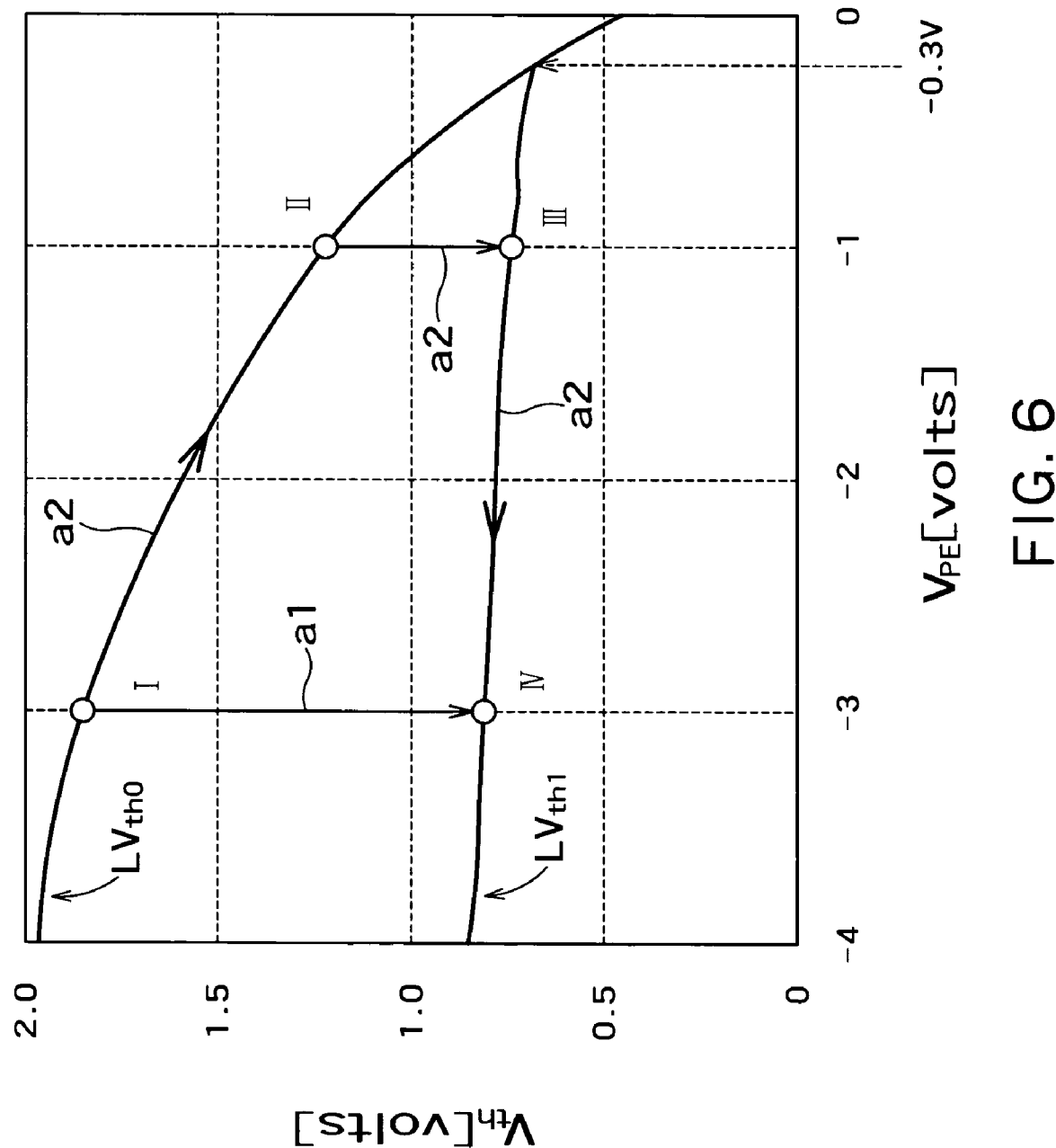
FIG. 6 is a graph showing a change of the threshold voltage Vth of the memory cell MC relative to the plate voltage $V_{PE}$.

Effects of this embodiment will be described with reference to FIG. 6. FIG. 6 is a graph that shows a change of the threshold voltage Vth of the memory cell MC relative to the plate voltage $V_{PE}$. A curve LVth0 indicates the threshold voltage of the memory cell MC storing the data "0". A line LVth1 indicates the threshold voltage of the memory cell MC storing the data "1".

With the source line voltage $V_{SL}$ set as a reference voltage (0V), if the plate voltage $V_{PE}$ is set deeper (lower) than about −0.3V, holes start to be accumulated in the body region 25 of the memory cell MC to store the data "1". However, no holes are accumulated in the body region 25 of the memory cell MC storing the data "0", and this memory cell MC is, therefore, in a full-depletion state. Accordingly, as the plate voltage $V_{PE}$ is lower, the threshold voltage Vth0 is higher. It is, therefore, preferable that the plate voltage $V_{PE}$ is set low so as to make the threshold voltage difference ΔVth between the memory cell MC storing the data "0" and the memory cell MC storing the data "1" sufficiently large in the data retention state.

However, if the plate voltage is excessively low, the threshold voltage Vth0 is excessively high. It is, therefore, required to set the word line voltage $V_{WL}$ higher than the source line voltage $V_{SL}$ by as much as the threshold voltage Vth0 when the data "1" is to be written to the memory cell MC that originally stores the data "0".

If the plate voltage $V_{PE}$ is kept at, for example, −3V when the data "1" is written to the memory cell MC, the threshold voltage Vth0 is about 1.8V. In consideration of overdrive, the word line voltage $V_{WL}$ should be set to about 2.2V. Namely, as indicated by an arrow a1 of FIG. 6, if a state I is directly changed to a stat IV, the word line voltage $V_{WL}$ needs to be about 2.2V. Accordingly, if the plate voltage $V_{PE}$ is kept constant, the word line voltage $V_{WL}$ having the large absolute value is required when the data is written. As a result, reliability of the peripherals may possibly be deteriorated as already stated.

According to the first embodiment, when the data "1" is written, the plate voltage $V_{PE}$ is temporarily reduced from −3V to −1V, thereby temporarily reducing the threshold voltage Vth0 (from the state I to a state II). At this time, a voltage is applied to the word line WLLi so as to write the data "1" to the memory cell MC (from the state II to a state III). Since the threshold voltage Vth0 is reduced to about 1.2V, it suffices that the word line voltage $V_{WL}$ is about 1.5V even in consideration of the overdrive. Thereafter, the plate voltage $V_{PE}$ is returned to the voltage (−3V) in the data holding state (from the state III to the state IV).

In this way, according to the first embodiment, during the data write operations, the absolute value of the plate voltage $V_{PE}$ is reduced (the potential difference between the plate voltage $V_{PE}$ and the source line voltage $V_{SL}$ is reduced), whereby the absolute value of the threshold voltage of the memory cell MC can be reduced. As a consequence, the potential of the word line can be suppressed to be lower than the breakdown voltage of the peripherals of the memory device, and the reliability of the peripherals can be maintained high.

Meanwhile, there is a concern that if the plate voltage $V_{PE}$ is thus changed, the data "1" stored in the memory cell is destructed. In order to prevent the data "1" from destruction, it is necessary not to decrease the number of holes originally present in the body region 25. To do so, the plate voltage $V_{PE}$ should be set so as not to apply the forward bias to a junction between the body region 25 and the source layer 21 and the junction between the body region 25 and the drain region 22. In FIG. 6, for example, the plate voltage $V_{PE}$ should not be set larger than −0.3V for the following reason. If the plate voltage $V_{PE}$ is set larger than −0.3V, then the forward bias is applied to these junctions and the holes are emitted from the body region 25 of the memory cell that stores the data "1".

In the first embodiment, the plate electrode PE is provided on the surface of the bulk silicon substrate 10. However, the advantages of the first embodiment can be attained even if the plate voltage $V_{PE}$ shown in FIG. 5 is applied to the bulk silicon substrate 10 without providing the plate electrode PE.

Second Embodiment

Figure 7:
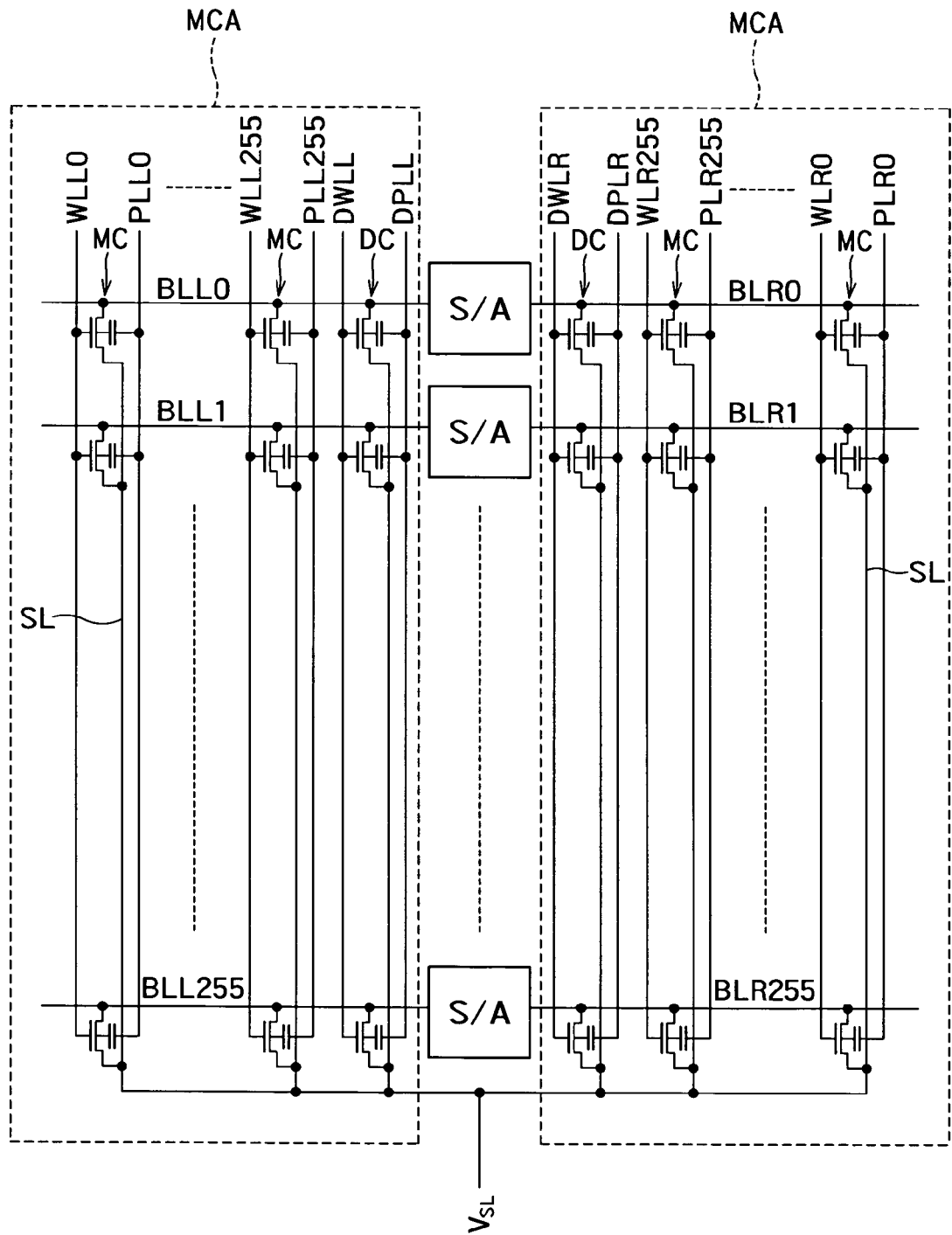
FIG. 7 is a circuit diagram showing a configuration of a semiconductor memory device 200 according to a second embodiment of the present invention.

FIG. 7 is a circuit diagram showing a configuration of a semiconductor memory device 200 according to a second embodiment of the present invention. The semiconductor memory device 200 according to the second embodiment differs from the semiconductor memory device 100 according to the first embodiment in the form of the plate electrode. Other constituent elements of the semiconductor memory device 200 according to the second embodiment may be equal to those according to the first embodiment.

Figure 8:
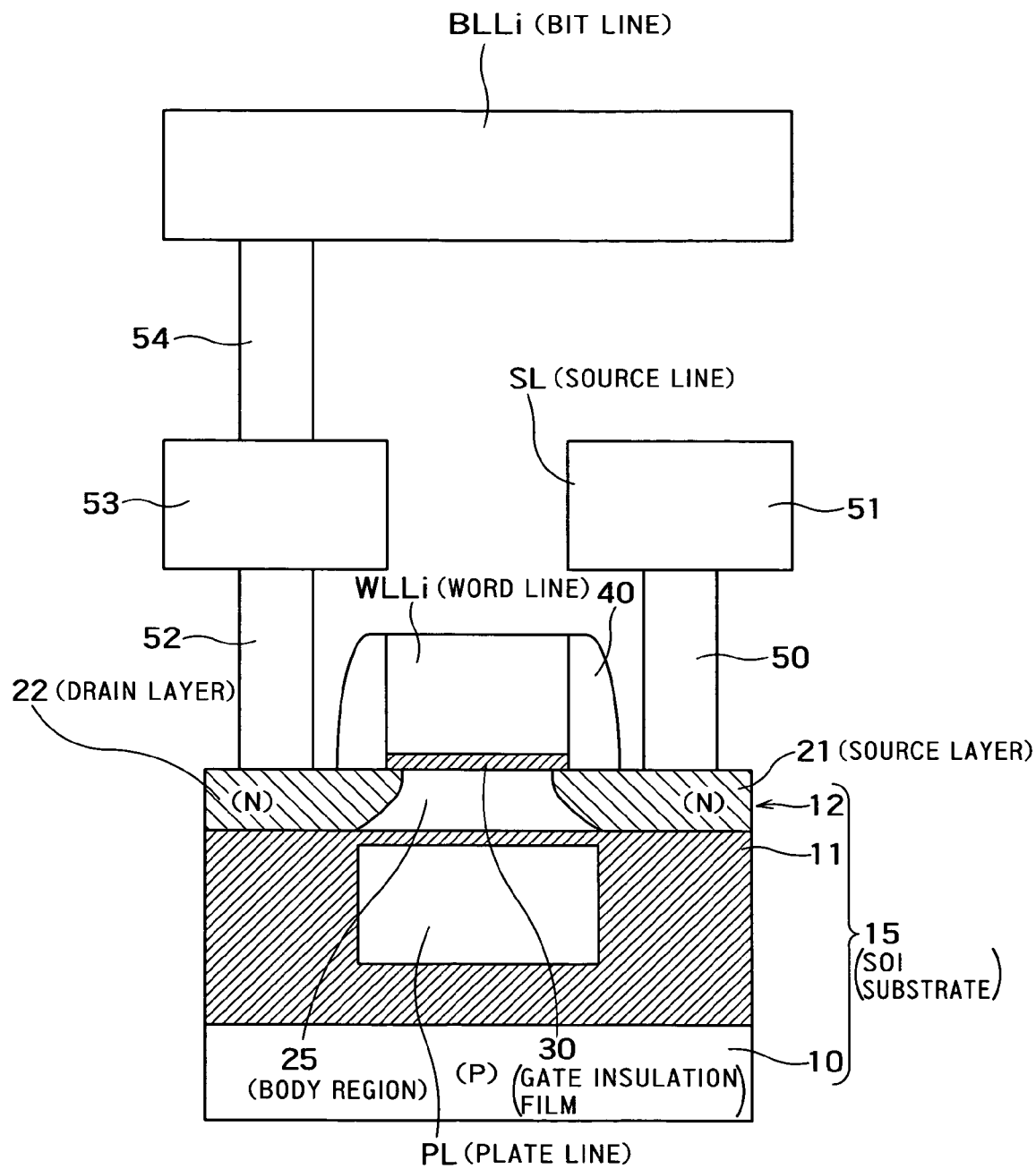
FIG. 8 is a cross-sectional view of one memory cell MC according to a second embodiment of the present invention.

In the second embodiment, plate lines PLL0 to PLL255 and PLR0 to PLR255 are provided as plate electrodes to correspond to the word lines WLL0 to WLL255 and WLR0 to WLR255, respectively. As shown in FIG. 8, these plate lines extend in parallel to the word lines. Further, each plate line PLL is provided within the BOX layer 11 and isolated from the body region 25 and the bulk silicon substrate 10. The plate line PLL may consist of any one of metal, doped polysilicon, doped monocrystalline silicon, and the like.

Operations performed by the semiconductor memory device 200 are basically the same as those performed by the semiconductor memory device 100 except for the following respects. Among the plate lines PLL0 to PLL255 and PLR0 to PLR255, only a plate line PLLi corresponding to the selected word line WLLi is driven as shown in FIG. 5, and the other plate lines are kept at the same voltages as those in the data retention state. Thus, the plate line PL functions as a back gate electrode and only the plate line PLLi corresponding to the selected row is driven.

Since it suffices to drive only the selected plate line PLLi, the semiconductor memory device 200 according to the second embodiment can operate at a high rate at low power consumption. In addition, the second embodiment exhibits the same advantages as those of the first embodiment.

Third Embodiment

Figure 9:
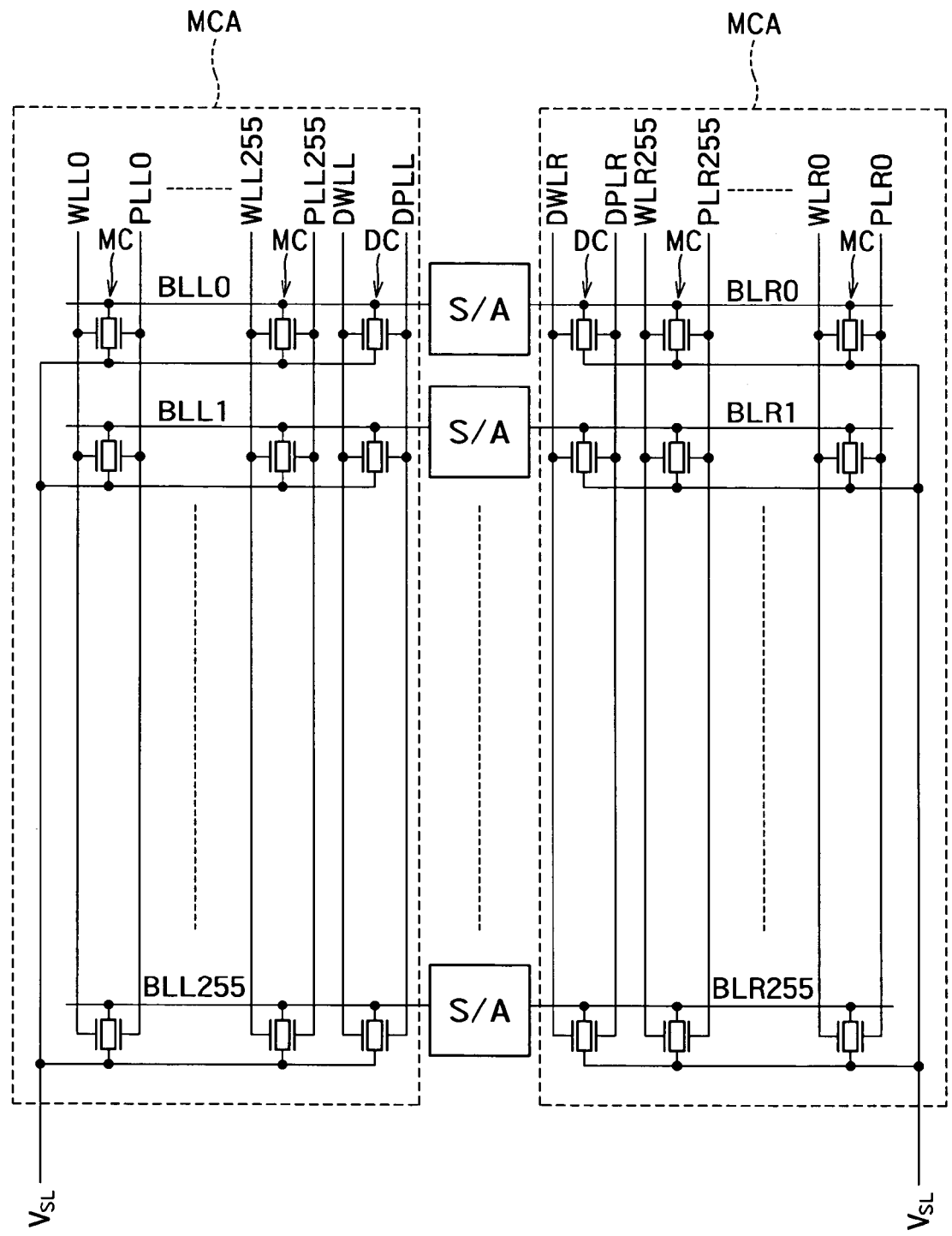
FIG. 9 is a circuit diagram showing a configuration of a semiconductor memory device 300 according to a third embodiment of the present invention.

FIG. 9 is a circuit diagram showing a configuration of a semiconductor memory device 300 according to a third embodiment of the present invention. The semiconductor memory device 300 according to the third embodiment differs from the semiconductor memory device 200 according to the second embodiment in that a FinFET is employed as the memory cell MC. Other constituent elements of the semiconductor memory device 300 according to the third embodiment may be equal to those according to the second embodiment.

Figure 10:
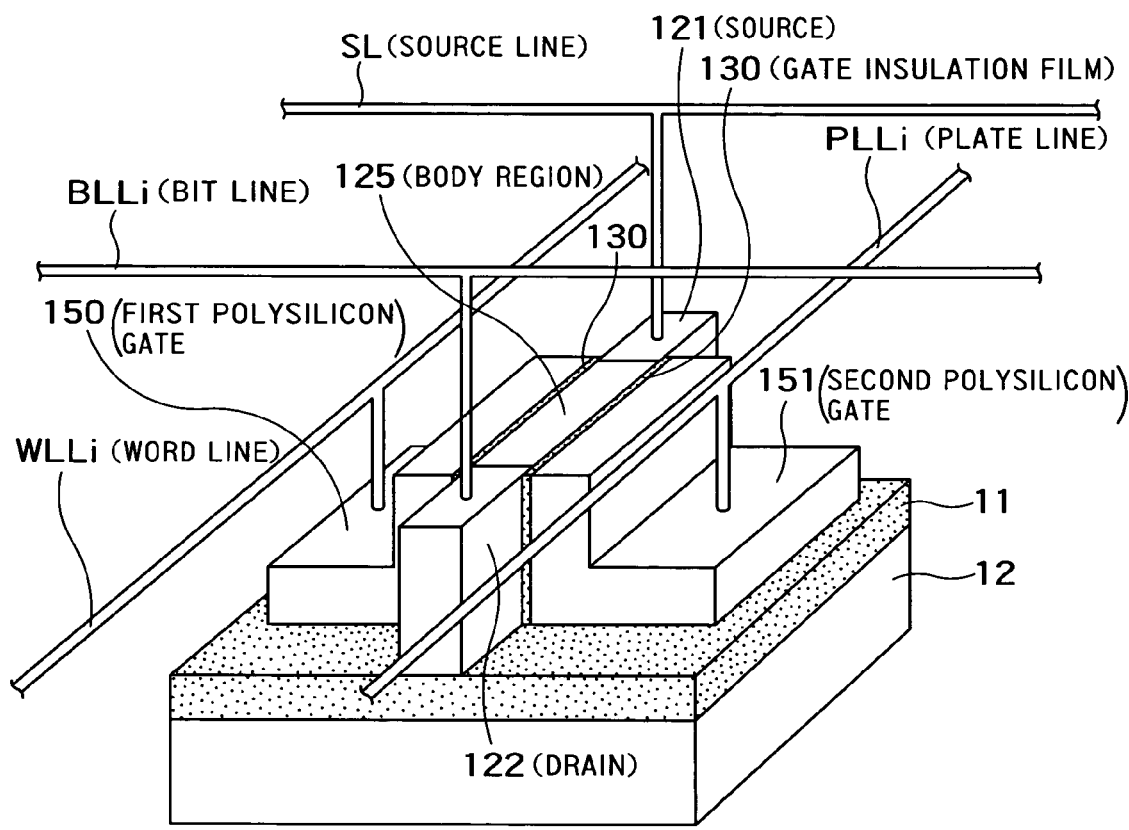
FIG. 10 is a perspective view that shows a configuration of the memory cell MC according to the third embodiment.

FIG. 10 is a perspective view that shows a configuration of the memory cell MC according to the third embodiment. In FIG. 10, interconnections are simplified for making a positional relationship among the interconnections clearer. The FinFET is employed as the memory cell MC according to the third embodiment. The FinFET includes the substrate 10, the BOX layer 11, a source 121, a drain 122, a body region 125, gate insulation films 130, a first polysilicon gate 150, a second polysilicon gate 151, a word line WLLi, a bit line BLLi, and a source line SLLi.

The source 121, the drain 122, and the body region 125 are formed in a Fin provided on the BOX layer 11. The gate insulation films 130 are provided on both side surfaces of the body region 125. The first polysilicon gate 150 is provided on one of the gate insulation film 130 and on the BOX layer 11, and electrically isolated from the substrate 10 and the body region 125. The second polysilicon gate 151 is provided on the other gate insulation film 130 and on the BOX layer 11, and electrically isolated from the substrate 10 and the body region 125.

The word line WLLi is connected to the first polysilicon gate 150 and the plate line PLLi is connected to the second polysilicon gate 151. The plate line PLLi extends in parallel to the word line WLLi. Since this memory cell MC is the Fin-FET, it is unnecessary to bury the plate line PLLi in the BOX layer 11. The semiconductor memory device 300 can be, therefore, manufactured relatively easily.

The source line SLLi is connected to the source 121 and the bit line BLLi is connected to the drain 122. The source line SLLi and the bit line BLLi extend in parallel to each other and are orthogonal to the word line WLLi.

Since operations performed by the semiconductor memory device 300 are equal to those performed by the semiconductor memory device 200 according to the second embodiment, they will not be described herein. The third embodiment exhibits the same advantages as those of the second embodiment.

FOURTH EMBODIMENT

Figure 11:
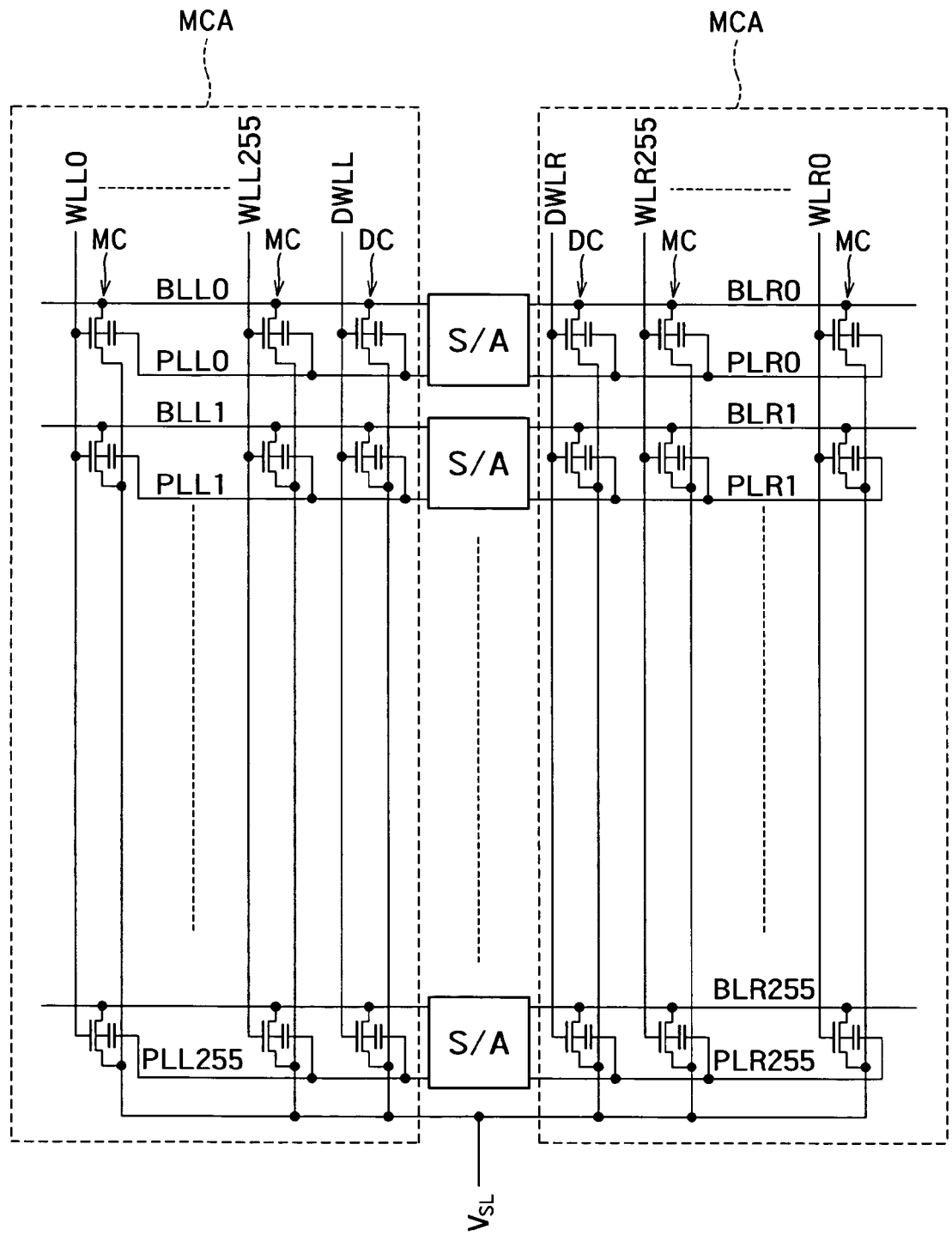
FIG. 11 is a circuit diagram showing a configuration of a semiconductor memory device 400 according to a fourth embodiment of the present invention.

FIG. 11 is a circuit diagram showing a configuration of a semiconductor memory device 400 according to a fourth embodiment of the present invention. The semiconductor memory device 400 according to the fourth embodiment differs from the semiconductor memory device 300 according to the third embodiment in the extension direction of the Fin and the positional relationship among interconnections. Other constituent elements of the semiconductor memory device 400 according to the fourth embodiment may be equal to those according to the third embodiment.

Figure 12:
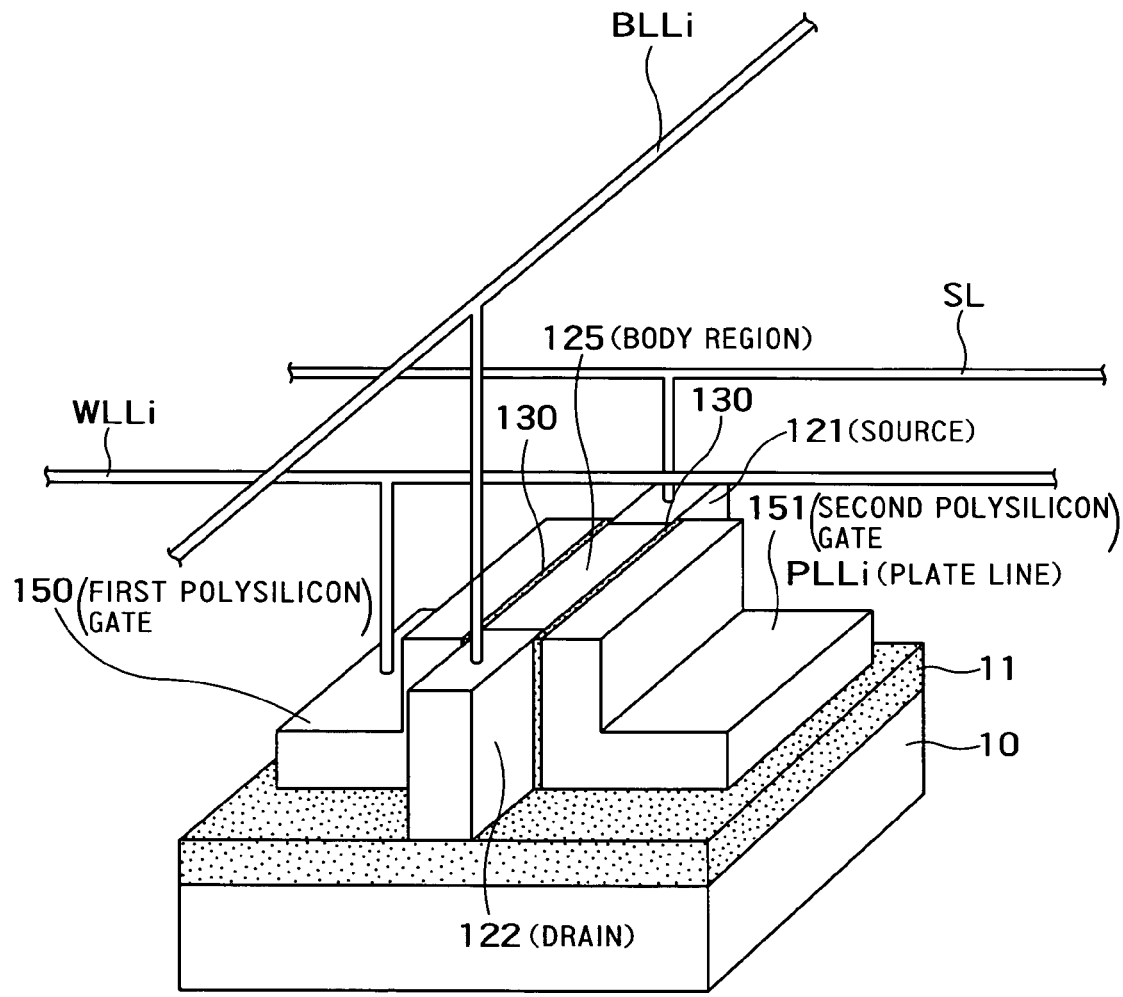
FIG. 12 is a perspective view showing a configuration of the memory cell MC according to the fourth embodiment.

FIG. 12 is a perspective view showing a configuration of the memory cell MC according to the fourth embodiment. In FIG. 12, the interconnections are simplified for making the positional relationship among the interconnections clearer. The Fin according to the fourth embodiment extends in parallel to the bit line BLLi. FIG. 12 is, therefore, a perspective view that is viewed from a different direction from that of FIG. 10 by 90 degrees.

In the memory cell MC according to the fourth embodiment, the second polysilicon gate 151 also functions as an interconnection of the plate line PLLi. It is, therefore, unnecessary to additionally provide the interconnection of the plate line PLLi. The source line SL extends in parallel to the word line WLLi.

Operations performed by the semiconductor memory device 400 are equal to those performed by the semiconductor memory device 200 according to the second embodiment except for the following respects. Only the plate line PLLi corresponding to the selected bit line BLLi is driven as shown in FIG. 5, and the other plate lines are kept at the same voltages as those in the data holding state. The fourth embodiment exhibits the same advantages as those of the third embodiment.

In the fourth embodiment, the second polysilicon gate 151 also functions as the interconnection of the plate line PLLi. Alternatively, the interconnection of the plate line PLLi may be provided in parallel to the bit line BLLi. In this case, the second polysilicon gate 151 may be provided per word line, and the adjacent second polysilicon gates 151 may be cut off from each other.

The invention claimed is:

1. A semiconductor memory device comprising:
    a semiconductor substrate including a semiconductor layer on a first insulation film;
    a memory cell including a source formed in the semiconductor layer, a drain formed in the semiconductor layer, and a floating body region provided between the source and the drain, the memory cell storing data according to an amount of the charges accumulated in the floating body region;
    a second insulation film provided on the floating body region of the memory cell;
    a word line provided on the second insulation film;
    a bit line connected to the drain;
    a source line connected to the source; and
    a plate electrode electrically insulated from the floating body region by the first insulation film, wherein
    in at least a part of a period for writing data to the memory cell, a potential of the plate electrode is changed to reduce an absolute value of a threshold voltage of the memory cell before writing data,
    data is written to the memory cell after the absolute value of the threshold voltage of the memory cell was reduced.

2. The semiconductor memory device according to claim 1, wherein
    in at least a part of a period for writing data to the memory cell, a potential difference between the plate electrode and the source line is reduced.

3. The semiconductor memory device according to claim 1, wherein
    in at least the part of the period for writing data to the memory cell, the absolute value of the potential of the plate electrode is reduced.

4. The semiconductor memory device according to claim 1, wherein
    the word line, the source line and the plate electrode are extended in parallel to each other in a memory cell array including the memory cells arranged in a matrix,
    the bit line is orthogonal to the word line.

5. The semiconductor memory device according to claim 1, wherein
    the plate electrode is a plate-shape electrode provided for a plurality of the word lines.

6. The semiconductor memory device according to claim 1, wherein
    the plate electrode is a line-shape electrode provided for each word line.

7. The semiconductor memory device according to claim 1, wherein
    the memory cell is a FinFET.

8. A semiconductor memory device comprising:
    a semiconductor substrate including a semiconductor layer on a first insulation film;
    a memory cell including a source formed in the semiconductor layer, a drain formed in the semiconductor layer, and a floating body region provided between the source and the drain, the memory cell storing data according to an amount of the charges accumulated in the floating body region;
    a second insulation film provided on the floating body region of the memory cell;
    a word line provided on the second insulation film;
    a bit line connected to the drain;
    a source line connected to the source; and a plate electrode electrically insulated from the floating body region by the first insulation film, wherein in at least a part of a period for writing data to the memory cell, a potential of the plate electrode is changed to reduce an absolute value of a threshold voltage of the memory cell, the memory cell is a FinFET, the word line is connected to a first gate provided on one side of a Fin portion of the FinFET, and the plate line is connected to a second gate provided on the other side of the Fin portion of the FinFET.

9. A semiconductor memory device comprising:

a semiconductor substrate including a semiconductor layer on a first insulation film;

a memory cell including a source formed in the semiconductor layer, a drain formed in the semiconductor layer, and a floating body region provided between the source and the drain, the memory cell storing data according to an amount of the charges accumulated in the floating body region;

a second insulation film provided on the floating body region of the memory cell;

a word line provided on the second insulation film;

a bit line connected to the drain;

a source line connected to the source; and a plate electrode electrically insulated from the floating body region by the first insulation film, wherein in at least a part of a period for writing data to the memory cell, a potential of the plate electrode is changed to reduce an absolute value of a threshold voltage of the memory cell, the memory cell is a FinFET, and the plate line is a second gate itself provided on the other side of the Fin portion of the FinFET.

10. A semiconductor memory device comprising:

a semiconductor substrate including a semiconductor layer on a first insulation film;

a memory cell including a source formed in the semiconductor layer, a drain formed in the semiconductor layer, and a floating body region provided between the source and the drain, the memory cell storing data according to an amount of charges accumulated in the floating body region;

a second insulation film provided on the floating body region of the memory cell;

a word line provided on the second insulation film;

a bit line connected to the drain; and a source line connected to the source, wherein the semiconductor substrate is electrically insulated from the floating body region by the first insulation film, and in at least a part of a period for writing data to the memory cell, a potential of the semiconductor substrate is changed to reduce an absolute value of a threshold voltage of the memory cell before writing data, data is written to the memory cell after the absolute value of the threshold voltage of the memory cell was reduced.

11. The semiconductor memory device according to claim 10, wherein in at least a part of a period for writing data to the memory cell, a potential difference between the semiconductor substrate and the source line is reduced.

12. The semiconductor memory device according to claim 10, wherein in at least the part of the period for writing data to the memory cell, the absolute value of the potential of the semiconductor substrate is reduced.

13. A driving method of a semiconductor memory device which comprises a semiconductor substrate including a semiconductor layer on a first insulation film; a memory cell including a source formed in the semiconductor layer, a drain formed in the semiconductor layer, and a floating body region provided between the source and the drain; a second insulation film provided on the floating body region of the memory cell; a word line provided on the second insulation film; a bit line connected to the drain; a source line connected to the source; and a plate electrode electrically insulated from the floating body region by the first insulation film, the method comprising:

changing a potential of the plate electrode in a data write operation from a potential of the plate electrode in a data retention state to reduce an absolute value of a threshold voltage of the memory cell before writing data; and writing data to the memory cell after the absolute value of the threshold voltage of the memory cell was reduced.

14. The driving method of a semiconductor memory device according to claim 13, wherein when data is written in the memory cell, a potential difference between the plate electrode and the source line is reduced.

15. The driving method of a semiconductor memory device according to claim 13, wherein when data is written in the memory cell, the absolute value of the potential of the plate electrode is reduced.

16. The driving method of a semiconductor memory device according to claim 13, wherein the memory cell is a FinFET.

17. A driving method of a semiconductor memory device which comprises a semiconductor substrate including a semiconductor layer on a first insulation film; a memory cell including a source formed in the semiconductor layer, a drain formed in the semiconductor layer, and a floating body region provided between the source and the drain; a second insulation film provided on the floating body region of the memory cell; a word line provided on the second insulation film; and a bit line connected to the drain; a source line connected to the source, wherein the semiconductor substrate is electrically insulated from the floating body region by the first insulation film, the method comprising:

changing a potential of the semiconductor substrate in a data write operation from a potential of the semiconductor substrate in a data retention state to reduce an absolute value of a threshold voltage of the memory cell before writing data; and writing data to the memory cell after the absolute value of the threshold voltage of the memory cell was reduced.

18. The driving method of a semiconductor memory device according to claim 17, wherein when data is written in the memory cell, a potential difference between the semiconductor substrate and the source line is reduced.

19. The driving method of a semiconductor memory device according to claim 17, wherein when data is written in the memory cell, the absolute value of the potential of the semiconductor substrate is reduced.

* * * * *